United States Patent [19]

Vry et al.

[11] Patent Number: 5,042,041
[45] Date of Patent: Aug. 20, 1991

[54] RADIATION SOURCE FOR PARTIALLY COHERENT RADIATION

[75] Inventors: Uwe Vry; Klaus Freischlad; Michael Küchel; Andreas Dorsel, all of Aalen, Fed. Rep. of Germany

[73] Assignee: Carl-Zeiss-Stiftung, Heidenheim, Fed. Rep. of Germany

[21] Appl. No.: 593,894

[22] Filed: Oct. 5, 1990

[30] Foreign Application Priority Data

Oct. 6, 1989 [DE] Fed. Rep. of Germany ....... 3933443

[51] Int. Cl.$^5$ ............................................. H01S 3/103
[52] U.S. Cl. .................................................... 372/28
[58] Field of Search ................... 372/26, 28, 38, 34, 372/44

[56] References Cited

U.S. PATENT DOCUMENTS 4,747,107 5/1988 Miller ..................................... 372/50
4,989,212 1/1991 Mecherle .............................. 372/28

Primary Examiner—Frank Gonzalez
Assistant Examiner—Susan S. Morse
Attorney, Agent, or Firm—Walter Ottesen

[57] ABSTRACT

The injection current for a laser diode is modulated so that a pregiven coherence function is obtained which drops off continuously at both ends outside of the coherence length. Several laser diodes are used for a very short coherence length for which the modulated wave numbers of the emitted radiation follow one another or overlap.

17 Claims, 6 Drawing Sheets

RADIATION SOURCE FOR PARTIALLY COHERENT RADIATION

FIELD OF THE INVENTION

The invention relates to a radiation source for coherent radiation and includes a laser diode and a supply unit by which the wave number k of the emitted radiation is modulated as a function of time (t) in a range within the boundary Values $k_{min}$ and $k_{max}$.

BACKGROUND OF THE INVENTION

An operation of the above kind of a laser diode is disclosed in the paper of H. Shimade et al entitled "Measurement of Coherence Characteristics of Semiconductor Laser Driven by High-Frequency Current Injection", *The Transactions of the IEICE*, volume E70, No. 11, November 1987. In this operation of a laser diode, a high-frequency current having a sinusoidal waveform is superposed on the injection current in order to reduce the coherence length of the emitted radiation. A reduction of the coherence length is advantageous in numerous devices which are based on interference because the signal-to-noise ratio is improved in this manner. In the above-mentioned paper, the current is modulated which directly effects a modulation of the wavelength or wave number of the emitted radiation and thereby changes the coherence length of the radiation. Since the wavelength or wave number can also be changed by the operating temperature of the laser diode, it is more appropriate to speak of the modulation of the wave number because the spectral distribution of the emitted radiation directly influences the coherence function.

For the signal-to-noise ratio of specific interferometric arrangements, not only is the coherence length of the radiation used decisive, but the overall coherence function, that is, the coherence coefficient as a function of the optical path difference. Most advantageous is a coherence function having a high coherence coefficient within the desired coherence length and a steepest possible and above all a continuous drop outside of the coherence length. Secondary maxima of the coherence coefficient outside of the coherence length are especially undesirable.

A disadvantage of the sinusoidal modulation of the injection current known from the above-mentioned paper is that for single-mode as well as multi-mode laser diodes numerous secondary maxima occur outside of the desired coherence length. For multi-mode diodes, the secondary maxima occur for optical path differences of a multiple of the double optical resonator length. For single-mode diodes, the position of the secondary maxima is primarily dependent upon the modulation amplitude.

SUMMARY OF THE INVENTION

It is an object of the invention to provide a radiation source having a radiation of a pregiven coherence length and having a coherence function which drops off steeply and continuously outside of the coherence length on both sides without secondary maxima. It is a further object of the invention to provide a radiation source having a very short coherence length and a coherence function without secondary maxima.

The radiation source of the invention is for partially coherent radiation. The radiation source includes: a single-mode laser diode means for emitting radiation having a wave number (k); a supply unit for supplying electrical energy to the diode means; the supply unit including modulation means for modulating the wave number (k) with a modulation function in dependence upon the time (t) within a range having the limit values $k_{min}$ and $k_{max}$; and, the modulation function fulfilling at least one of the following conditions:

if $k > k_{min} + 3(k_{max} - k_{min})/4$, then $d^2k/dt^2 > 0$, if $k < k_{min} + (k_{max} - k_{min})/4$, then $d^2k/dt^2 < 0$.

According to another feature of the invention, the radiations of at least two single-mode laser diodes are brought together spatially and congruently so that the wave number (k) of the emitted radiations are modulated in dependence upon time (t) with modulation functions in wave number ranges which follow one another or overlap and that, for the modulation function of a laser diode having the limit values $k_{min}$ and $k_{max}$, at least one of the following conditions is fulfilled:

if $k > k_{min} + 3(k_{max} - k_{min})/4$, then $d^2k/dt^2 > 0$, if $k < k_{min} + (k_{max} - k_{min})/4$, then $d^2k/dt^2 < 0$.

It is especially advantageous to obtain the desired modulation function of the wave number by a modulation of the injection current for the laser diode or laser diodes. For this purpose, it is only necessary to compute the required modulation function of the injection current from the characteristics of the laser diode wave number as a function of the injection current and the power as a function of the injection current at constant operating temperature for the determined modulation function.

However, it is also possible to modulate the operating temperature of the laser diode or diodes. In this case, the modulation function of the operating temperature is computed from the characteristics of the laser diode as a function of the operating temperature and the power as a function of the operating temperature at constant injection current. In this case, the laser diode must have the smallest possible thermal capacity which is especially the case when the temperature of the layer emitting the radiation is controlled directly.

A combination of modulation of the injection current and modulation of the operating temperature is possible.

The modulation can basically take place by means of any other operating parameter which changes the wave number. Accordingly, a modulation via the pressure which is applied to the laser diode is possible. In addition, the modulation can also take place at constant operating parameters of the laser diode by an external change of the wave number, for example, by phase modulating with a Pockels cell.

The modulation can take place once, several times or periodically.

It is necessary to operate the laser diode or diodes in the so-called mode jump-free range because otherwise, secondary maxima will occur in the coherence function.

The characteristics of laser diodes such as the wave number as a function of injection current are different from one diode to another. For this reason, and when high requirements are imposed on the coherence function of the emitted radiation, it is advantageous to determine an individual modulation function for each diode. For this purpose, one first obtains the spectral function corresponding thereto from the desired coherence function via Fourier transformation. Thereafter, for each laser diode, the modulation function is determined from the spectral function and characteristics of the particular laser diode.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
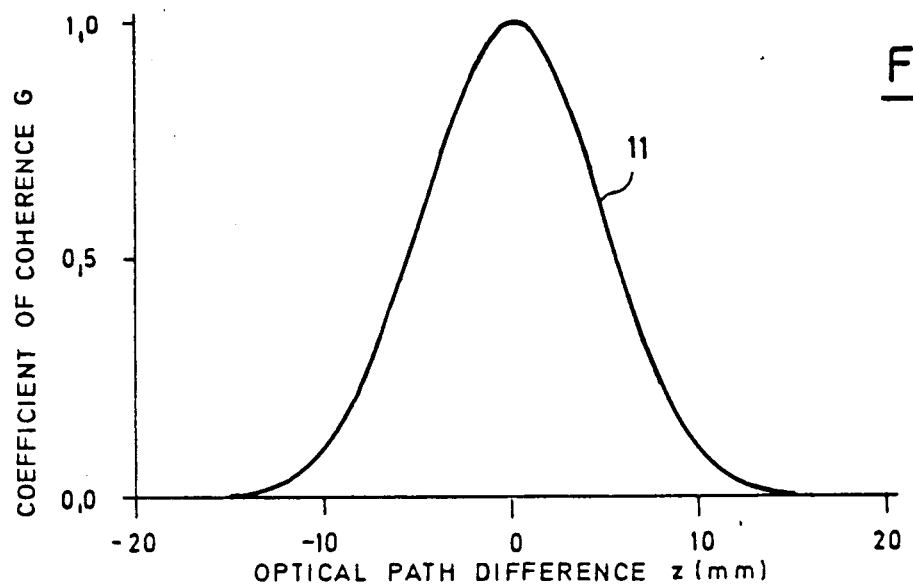
FIG. 1 is a curve of an advantageous coherence function.

It is advantageous to use as a coherence function, a function to which the Fourier transformation can be simply applied. This is the case, for example, for a Gaussian coherence function such as shown in FIG. 1 and identified with reference numeral 11. There, the coherence coefficient is plotted as a function of the optical path difference (z). The Gaussian coherence function is given by:

$$|G(z)| = \exp\left(-\frac{c^2 z^2}{4}\right) \tag{1}$$

wherein c is a constant which determines the width of the bell-shaped Gaussian function.

Figure 2:
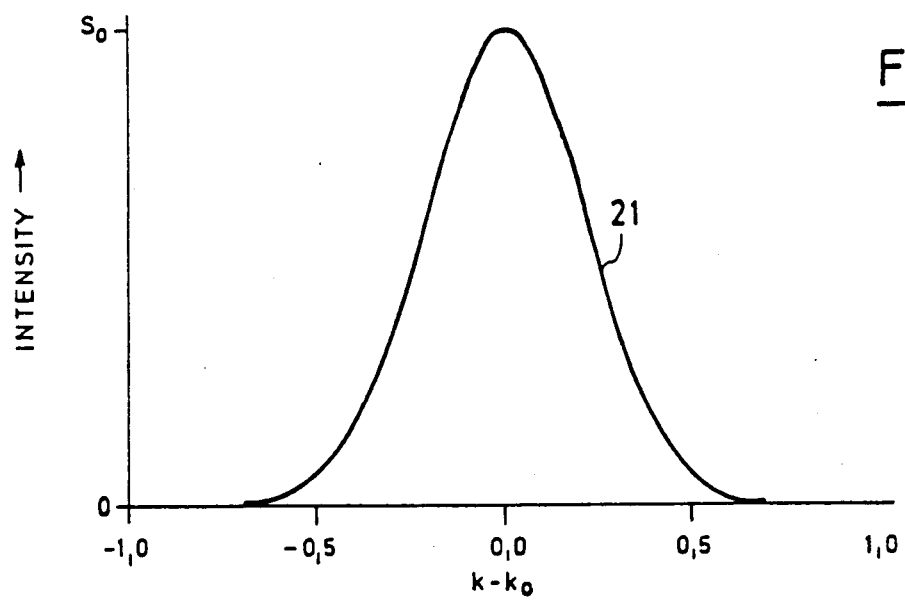
FIG. 2 is the spectral function corresponding to the coherence function of FIG. 1.

The corresponding spectral function (intensity as a function of wave number) is:

$$S(k) = s_o \exp\left(-\frac{(k - k_o)^2}{c^2}\right) \tag{2}$$

and is shown in FIG. 2 and identified by reference numeral 21. In this function, k is the wave number, $k_o$ is the wave number of the maximum of the spectral function and $s_o$ is the maximum value of the spectral function.

The realization of such a spectral function will now be explained.

If radiation having a radiation power P incidents upon a detector, then, after a measuring time $\Delta t$, the energy $$W = P \cdot \Delta t$$

has been received. If the wave number of the radiation changes in several steps during the measuring time, then a radiation incidents upon the detector with the power P(k) and the wave number k for each time increment of $\Delta t(k)$. The measured energy then is given by:

$$W = \sum_k P(k) \cdot \Delta t(k) \tag{4}$$

For generalizing to a continuous modulation of the wavelength, the following results:

$$W = \int P(k) \cdot \left|\frac{dt}{dk}\right| dk = \int S(k) \, dk \tag{5}$$

The spectral function:

$$S(k) = P(k) / \left|\frac{dk}{dt}\right| . \tag{6}$$

is introduced with respect to the foregoing. $|dk/dt|$ is the velocity with which the wave number k is passed through.

The spectral function indicates the effective spectrum which is generated by the laser diode. The time coherence function, that is the normalized coefficient of coherence $|G(z)|$ of the laser diode with the effective spectrum S(k) as a function of the optical path difference (z) is given in known manner by the Fourier relationship:

$$|G(z)| = \left|\frac{\int S(k) \exp(ikz) \, dk}{\int S(k) \, dk}\right| \tag{7}$$

In the following, the case is first considered wherein only one laser diode is used as a light source. In this case, the spectral function of equation (2) must be generated by a modulation of the wave number of this diode according to equation (6) which considers the dependence of the output power of the laser diode on the wave number. For determining the modulation function k(t), equation (6) is inverted:

$$\frac{dk}{dt} = \pm \frac{P(k)}{S(k)} \tag{8}$$

The sign is determined by the direction in which the wave number is to be modulated.

The desired spectral function S(k) must be inserted into equation (8). In addition, the output power of the diode as a function of the wave number is required and the practical determination thereof is shown in context of an example which follows.

Figure 3:
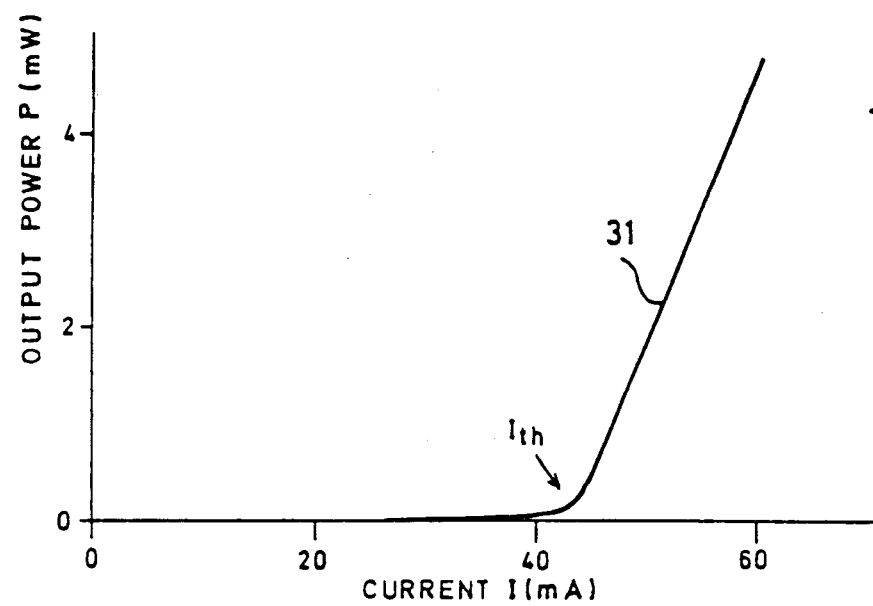
FIG. 3 is a characteristic of a laser diode showing the output power as a function of the injection current.

FIG. 3 shows a typical power characteristic 31 of a laser diode (output power P as a function of the injection current I) for a fixed operating temperature. The curve is generally linear above the threshold current $I_{th}$ at which the laser operation starts.

Figure 4:
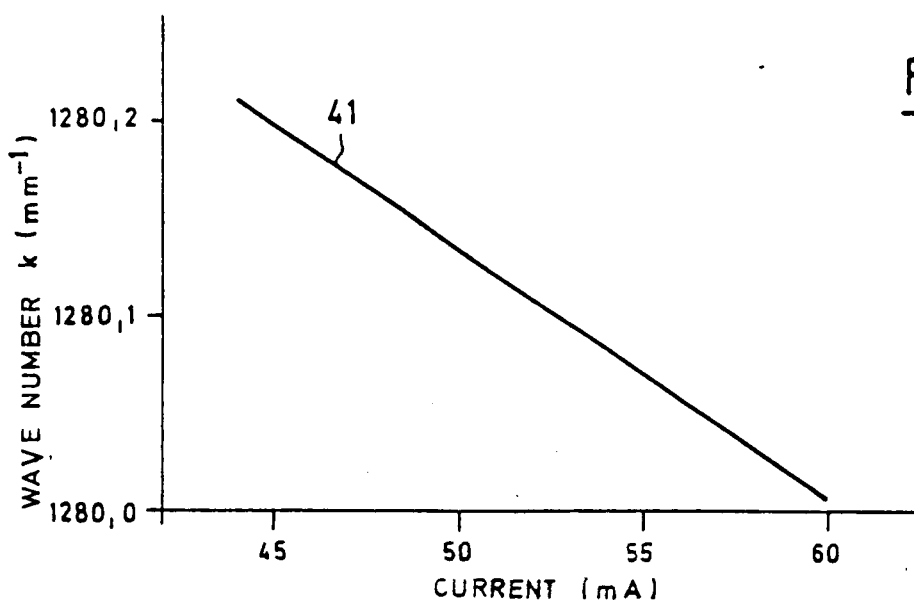
FIG. 4 is a characteristic of a laser diode showing the wave number as a function of the injection current.

FIG. 4 shows a characteristic 41 for the dependence of the wave number of the emitted radiation on the injection current. The constant operating temperature is so selected that no mode jump occurs in the entire current range.

Figure 5:
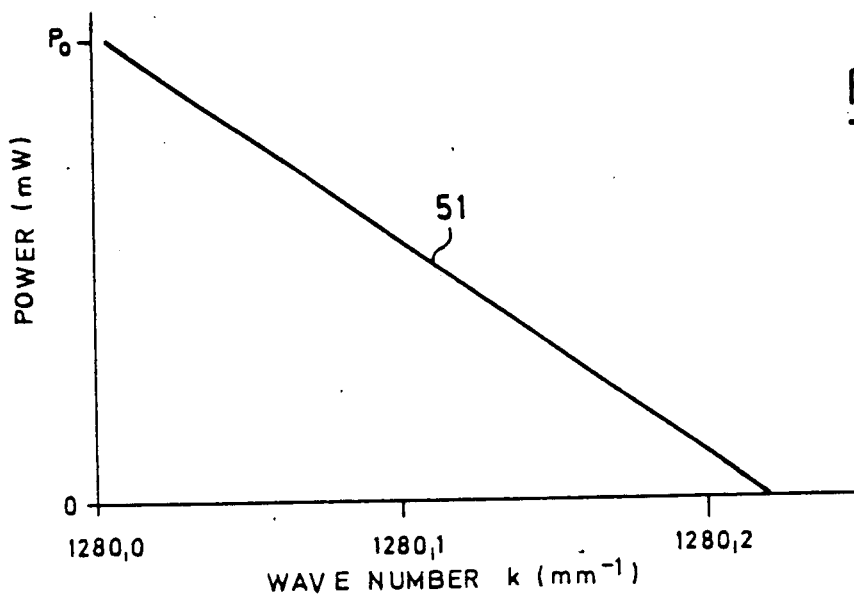
FIG. 5 is a characteristic showing the power as a function of wave number determined from the characteristics of FIGS. 3 and 4.

In FIG. 5, FIGS. 3 and 4 are combined to form a power characteristic P(k) 51 which defines the relationship between power and wave number. This relationship can be described in this example as a triangular function:

$$P(k) = \begin{cases} \frac{P_o}{2}(k_o - k + \Delta k)/\Delta k & \text{for } |k - k_o| < \Delta k \\ 0 & \end{cases} \quad (9)$$

if the above condition is not fulfilled. In the above, the output power is 0 at the laser threshold for $k_o + \Delta k$; whereas, the output power has the value $P_o$ for $k_o - \Delta k$. $\Delta k$ is half the width of the wavelength range which can be covered by the laser diode and $k_o$ is the mean wave number of this range.

Figure 6:
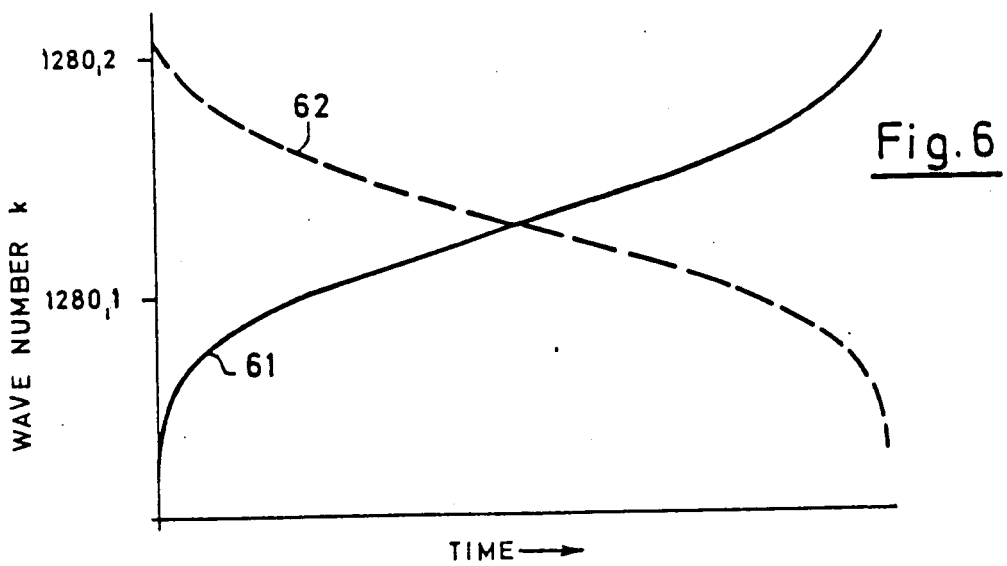
FIG. 6 shows two modulation functions.

In FIG. 6, reference numeral 61 identifies a typical curve of a modulation function k(t) which results as a solution of equation (8) with equations (2) and (9) for the case wherein an individual laser diode is used as light source and in equation (8) the positive sign is selected. FIG. 5 shows the relationship between the wave number and the current and from this relationship, the corresponding modulation function I(t) can be determined.

If the minus sign is selected in equation (8), then the modulation function k(t) identified by 62 is obtained. This modulation function differs from the function 61 only by the direction of the time axis.

Figure 7A:
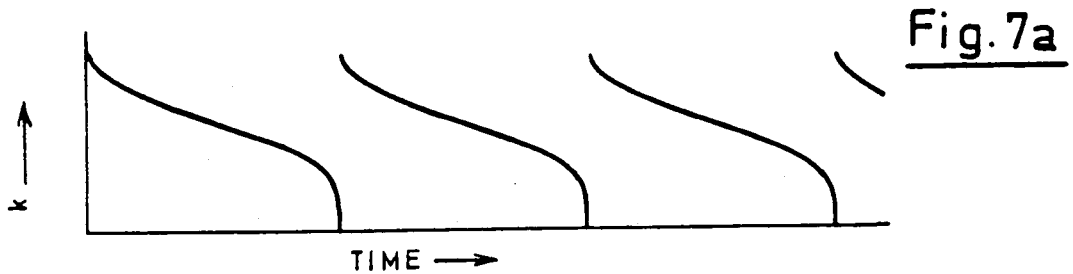
FIG. 7a is first possible combination of the modulation functions in FIG. 6.
Figure 7B:
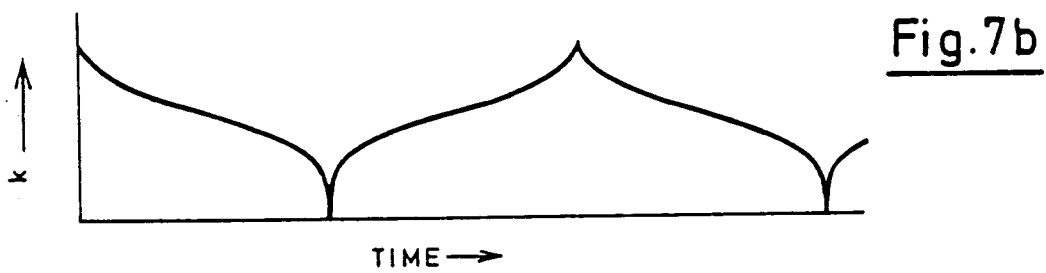
FIG. 7b is a second possible combination of the modulation functions shown in FIG. 6.

Modulation functions can be put together in many ways from the two functions of FIG. 6. Two possible examples are shown in FIGS. 7a and 7b, respectively.

If a coherence function is to be obtained which contains no secondary maxima, then a drop of the spectral function S(k) to the edge of the wave number range $(k_o \pm \Delta k)$ covered by the diode is required. This results from equation (7) and the known characteristics of the Fourier transformation. The output power drops linearly with the wave number in the illustrated embodiment. Accordingly, the following applies in the range of high output power (in the illustrated embodiment, this is the range of low wave numbers wherein $k < k_o$):

$$\frac{dS}{dk} > 0, \quad \frac{dP}{dk} < 0 \quad (10)$$

By time differentiating equation (8), applying the chain and product rule and subsequently using equation (8) again, the following applies for any desired sign in equation (8):

$$\frac{d^2k}{dt^2} < 0 \quad \text{for } k < k_o \quad (11)$$

If the output power increases with the wave number of the diode, differently from that of the illustrated embodiment, then in lieu of equation (10), the following applies for $k > k_o$:

$$\frac{dS}{dk} < 0, \quad \frac{dP}{dk} > 0 \quad (12)$$

In this case, the following applies:

$$\frac{d^2k}{dt^2} > 0 \quad \text{for } k > k_o \quad (13)$$

One of the above conditions must be fulfilled if the coherence function is to have no secondary maxima. The conditions are not fulfilled by the sinusoidal modulation used by Shimade et al referred to above. For this reason, the coherence function generated in this manner must have secondary maxima. Also, other known modulation functions such as triangular, sawtooth or rectangular functions do not fulfill this criteria.

A very wide width of the spectral function is required if a coherence function having a very narrow width, that is, a very short coherence length is to be generated. Since the spectral range which is covered by an individual laser diode without mode jumps is limited, it is advantageous for very short coherence lengths to couple (that is spatially overlap) a plurality of laser diodes having spectral ranges which follow one another or overlap, that is, the laser diodes are spatially superposed.

Figure 8:
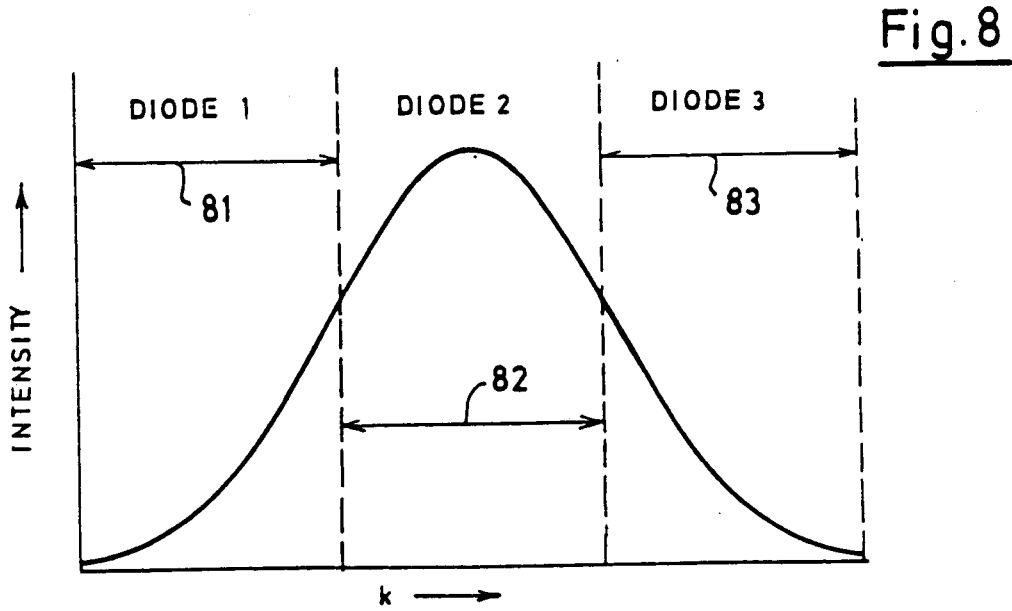
FIG. 8 shows a spectral function subdivided into modulation ranges for three diodes.
Figure 9:
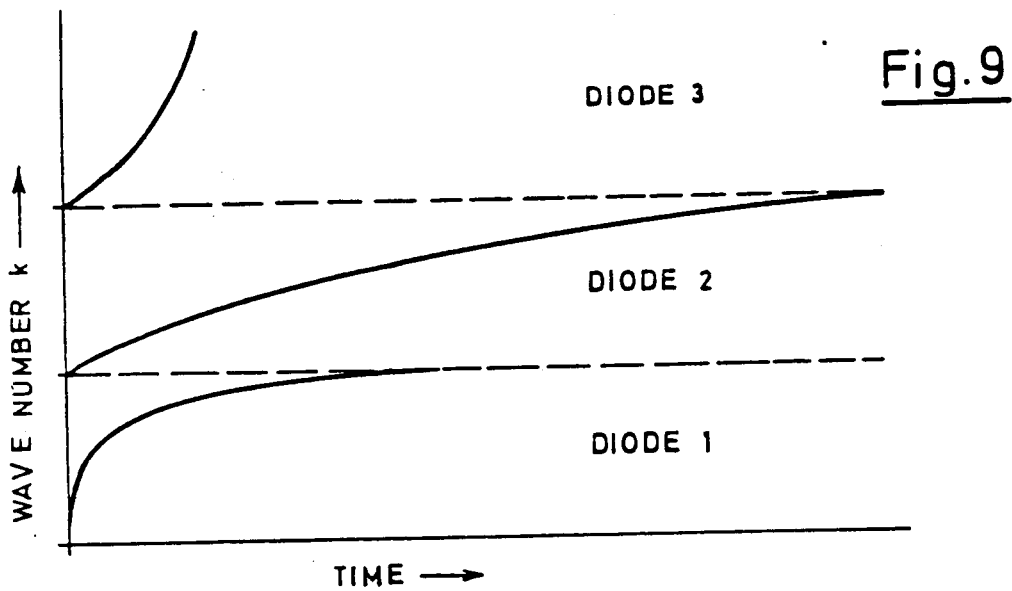
FIG. 9 shows the modulation functions for the three diodes.

In another embodiment of the invention, three diodes are used and are identified by reference numerals 1, 2 and 3. In FIG. 8, each diode takes over a portion of the spectral function; that is, their radiation is modulated in one of the ranges (81, 82, 83). However, it also possible that each diode takes over a specific portion of the spectral function with the ranges overlapping. Each diode must have its own modulation function which, according to equation (8), is separately computed for each diode while considering the portion of the spectral function covered thereby. FIG. 9 shows these modulation functions for positive sign in the equation (8) and for the power characteristics for which dP/dk <0.

The determination was made above with only one diode being used that, if dP/dk <0, then the condition must be present that $d^2k/dt^2 < 0$ in the range of high output power. This determination can be transferred to diode 1 which takes over the portion of the spectral function having the lowest wave number. If dP/dk >0, then the concept set forth for this case above applies to the diode 3 having the highest wave numbers.

Figure 10:
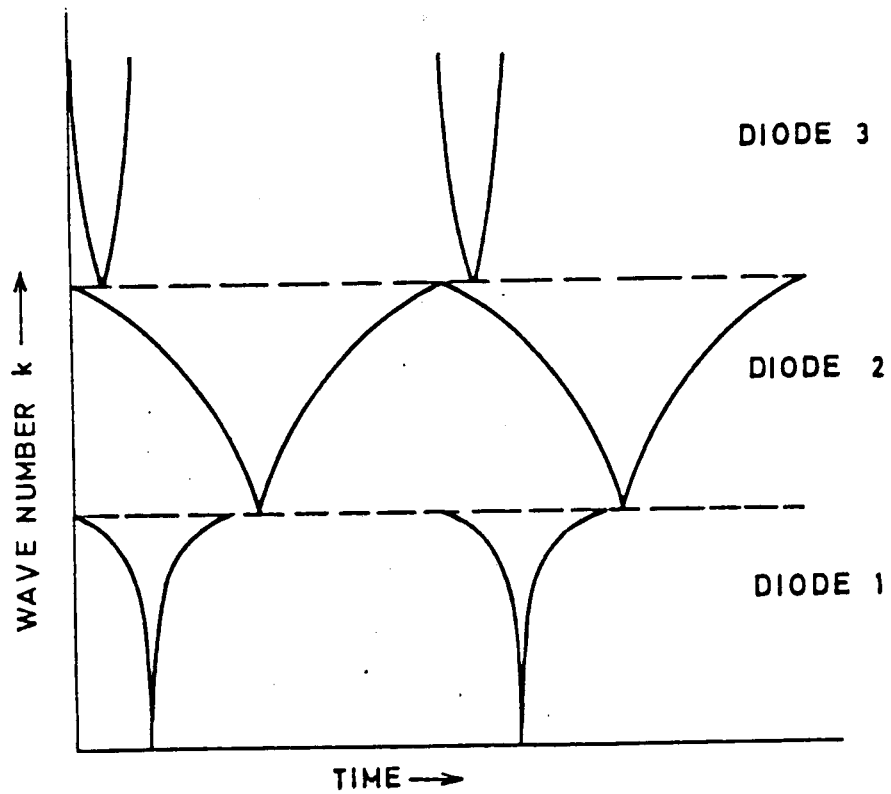
FIG. 10 is one possible combination of the modulation functions for each of the three diodes and their relationship to each other.

FIG. 10 shows possible combinations of the three modulation functions and their relationships to each other for a practical operating case. For this purpose, the time axis is shortened with respect to FIG. 9 by approximately the factor 5. Furthermore, the premise was taken that the superposition of the three radiations of the diodes takes place so that the attenuations affected by the optical elements for superposing the radiations are the same for all diodes. Since passing through the modulation, for example for diode 1, is shorter than for diode 2, diode 1 must be switched off for a corresponding time. If the earlier switch-off is to be omitted and in lieu thereof, the time scale for diode 1 is extended by a specific factor, then this diode must be attenuated by the same factor with respect to the other diodes. The same applies to diode 3.

Figure 11:
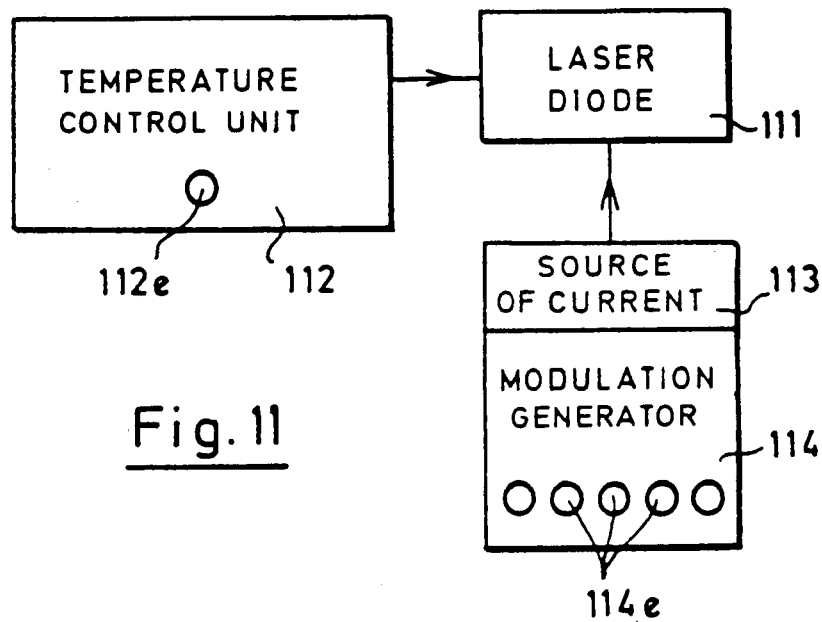
FIG. 11 is a block diagram for realizing a modulation function.

FIG. 11 shows an embodiment with which the invention is technically realized and includes a block diagram for supplying a laser diode with modulated injection current. The laser diode is identified by reference numeral 111 and is held at a constant temperature by the temperature control unit 112. This control unit can comprise a temperature sensor, a Peltier element and a controller. A temperature is adjusted at the adjustment unit 112e which forms the basis of the modulation function. The laser diode 111 receives its injection current from the current source 113 to which a modulation generator 114 is connected. The modulation generator 114 has adjusting elements 114e at which values or parameters for the modulation function I(t) are directly adjusted.

Figure 12:
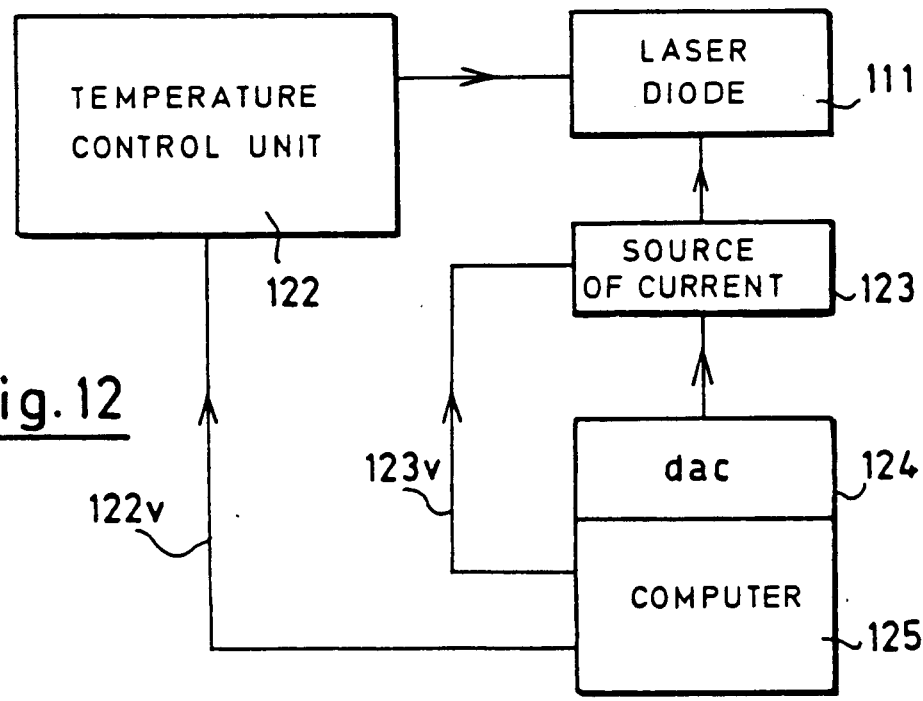
FIG. 12 is a block diagram showing another realization of a modulation function.

In FIG. 12, another embodiment is shown for the modulated current supply. The values for the modulation function I(t) are stored in a computer 125 or microprocessor. From this computer, the required temperature of the laser diode is transmitted via the connection 112v to the temperature control unit 122 which controls the laser diode to this temperature. The modulation function I(t) is transmitted to the current source 123 from computer 125 via the digital-to-analog converter 124. The current source 123 further receives the value for the constant portion of the modulated injection current supplied to the laser diode via the connection 123v.

If several laser diodes are used simultaneously in order to obtain a very short coherence length, then a separate current supply is necessary for each laser diode. The computer or microprocessor is required only once and, for each laser diode, a temperature control unit and a current source which can be modulated is connected thereto.

It is understood that the foregoing description is that of the preferred embodiments of the invention and that various changes and modifications may be made thereto without departing from the spirit and scope of the invention as defined in the appended claims.

What is claimed is:

1. A radiation source for partially coherent radiation, the radiation source comprising:
   single-mode laser diode means for emitting radiation having a wave number (k);
   a supply unit for supplying electrical energy to said diode means;
   said supply unit including modulation means for modulating said wave number (k) with a modulation function in dependence upon the time (t) within a range having the limit values $k_{min}$ and $k_{max}$; and,
   said modulation function fulfilling at least one of the following conditions:
   (a) if $k > k_{min} + 3(k_{max} - k_{min})/4$, then $d^2k/dt^2 > 0$; and
   (b) if $k < k_{min} + (k_{max} - k_{min})/4$, then $d^2k/dt^2 < 0$.

2. The radiation source of claim 1, wherein said supply unit supplies an injection current to said laser diode means; and, said modulation means modulates said wave number (k) via said injection current.

3. The radiation source of claim 1, wherein said radiation source includes temperature control means for controlling the operating temperature of said laser diode means; and, said modulation means modulates said wave number (k) via said operating temperature.

4. The radiation source of claim 1, wherein said radiation source includes temperature control means for controlling the operating temperature of said laser diode means; said supply unit supplies an injection current to said laser diode means; and, said modulation means modulates said wave number (k) via said injection current and said operating temperature.

5. The radiation source of claim 1, wherein said laser diode means is an individual laser diode; and, said supply unit including inputting means for inputting an individual modulation function into said laser diode.

6. The radiation source of claim 1, wherein said laser diode means is an individual laser diode; and, said modulation means including a modulation generator for inputting an individual modulation function having values into said laser diode; and, said modulation generator including adjusting elements for adjusting values of said modulation function.

7. The radiation source of claim 1, wherein said laser diode means is an individual laser diode; and, said modulation means including a modulation generator for inputting an individual modulation function having parameters into said laser diode; and, said modulation generator including adjusting elements for adjusting parameters of said modulation function.

8. The radiation source of claim 5, wherein said laser diode means is an individual laser diode; said supply unit including a current source for supplying an injection current to said laser diode; and, computer means for storing an individual modulation function for said laser diode; and, a digital-to-analog converter for transmitting said modulation function from said computer means to said current source.

9. A radiation source for partially coherent radiation, the radiation source comprising:
   at least two single-mode laser diodes for emitting radiation which is spatially and congruently brought together and has a wave number (k);
   a supply unit including modulation means for modulating said wave number (k) with a modulation function in dependence upon the time (t) in respective wave number ranges; said ranges being disposed one next to the other or being in overlapping relationship to each other; and,
   for the modulation function of one laser diode, at least one of the following conditions are fulfilled:
   (a) if $k > k_{min} + 3(k_{max} - k_{min})/4$, then $d^2k/dt^2 > 0$
   (b) if $k < k_{min} + (k_{max} - k_{min})/4$, then $d^2k/dt^2 < 0$.

10. The radiation source of claim 9, wherein said supply unit supplies an injection current to said laser diodes; and, said modulation means modulates said wave number (k) via said injection current.

11. The radiation source of claim 9, wherein said radiation source includes temperature control means for controlling the operating temperature of said laser diodes; and, said modulation means modulates said wave number (k) via said operating temperature.

12. The radiation source of claim 9, wherein said radiation source includes temperature control means for controlling the operating temperature of said laser diodes; said supply unit supplies an injection current to said laser diodes; and, said modulation means modulates said wave number (k) via said injection current and said operating temperature.

13. The radiation source of claim 9, said supply unit including inputting means for inputting an individual modulation function into said laser diodes.

14. The radiation source of claim 9, said modulation means including a modulation generator for inputting an individual modulation function having values into said laser diodes; and, said modulation generator including adjusting elements for adjusting values of said modulation function.

15. The radiation source of claim 9, said modulation means including a modulation generator for inputting an individual modulation function having parameters into said laser diode; and, said modulation generator including adjusting elements for adjusting parameters of said modulation function.

16. The radiation source of claim 13, said supply unit including a current source for supplying an injection current to said laser diodes; and, computer means for storing an individual modulation function for said laser diodes; and, a digital-to-analog converter for transmitting said modulation function from said computer means to said current source.

17. A method for determining the modulation function for a radiation source for partially coherent radiation, the radiation source including: single-mode laser diode means for emitting radiation having a wave number (k); a supply unit for supplying electrical energy to said diode means; said supply unit including modulation means for modulating said wave number (k) with a modulation function in dependence upon the time (t) within a range having the limit values $k_{min}$ and $k_{max}$; and, said modulation function fulfilling at least one of the following conditions:

(a) if $k > k_{min} + 3(k_{max} - k_{min})/4$, then $d^2k/dt^2 > 0$; and (b) if $k < k_{min} + (k_{max} - k_{min})/4$, then $d^2k/dt^2 < 0$;

the method comprising the steps of:
determining the spectral function (21) required for said modulation functions from the desired coherence function (11) via Fourier transformation; and, modulation function (61, 62) from the spectral function (21) and the following characteristics of said laser diode means: the wave number as a function of the injection current (31); and, power as a function of the injection current (41).

* * * * *

UNITED STATES PATENT AND TRADEMARK OFFICE
CERTIFICATE OF CORRECTION

PATENT NO. : 5,042,041

DATED : August 20, 1991

INVENTOR(S) : Uwe Vry, Klaus Freischlad, Michael Küchel and Andreas Dorsel

It is certified that error appears in the above-identified patent and that said Letters Patent is hereby corrected as shown below:

In column 1, line 10: delete "Values" and substitute -- values -- therefor.

In column 4, line 6: add -- (3) -- on the right margin.

In column 10, line 17: insert -- determining the -- before "modulation".

Signed and Sealed this

Twenty-seventh Day of April, 1993

Attest:

MICHAEL K. KIRK

*Attesting Officer*     Acting Commissioner of Patents and Trademarks